United States Patent
Asai et al.

[11] Patent Number: 6,012,222
[45] Date of Patent: Jan. 11, 2000

[54] ELECTRONIC-COMPONENT MOUNTING HEAD, ELECTRONIC-COMPONENT MOUNTING APPARATUS, AND ELECTRONIC-COMPONENT MOUNTING METHOD

[75] Inventors: Koichi Asai, Nagoya; Kunio Oe, Chiryu; Seiichi Terui, Okazaki, all of Japan

[73] Assignee: Fuji Machine Mfg. Co., Ltd., Chiryu, Japan

[21] Appl. No.: 09/040,590

[22] Filed: Mar. 18, 1998

Related U.S. Application Data

[62] Division of application No. 08/627,993, Apr. 4, 1996, Pat. No. 5,758,410.

[30] Foreign Application Priority Data

Apr. 10, 1995 [JP] Japan ........................................ 7-83834

[51] Int. Cl.⁷ .................................................. H05K 3/30
[52] U.S. Cl. ........................... 29/832; 29/712; 29/740; 29/743
[58] Field of Search ........................... 29/709, 712, 705, 29/832, 834, 739, 740, 743

[56] References Cited

U.S. PATENT DOCUMENTS

| | | | |
|---|---|---|---|
| 4,510,683 | 4/1985 | Fedde et al. | 29/701 |
| 4,515,507 | 5/1985 | Asai et al. | 29/743 |
| 4,527,327 | 7/1985 | Van Deuren | 29/740 |
| 4,611,397 | 9/1986 | Janisiewicz et al. | 29/740 |
| 4,747,198 | 5/1988 | Asai et al. | 29/407 |
| 4,850,780 | 7/1989 | Safabakhsh et al. | 294/64.1 |
| 4,858,308 | 8/1989 | Komori | 29/743 |
| 4,860,438 | 8/1989 | Chen | 29/740 |
| 4,950,011 | 8/1990 | Borcea, et al. | 294/2 |
| 5,033,783 | 7/1991 | Izumi et al. | 294/64.1 |
| 5,060,366 | 10/1991 | Asai et al. | 29/739 |
| 5,159,745 | 11/1992 | Kato | 29/407 |
| 5,168,622 | 12/1992 | Peyroux | 29/709 |
| 5,195,235 | 3/1993 | Mifuji | 29/721 |
| 5,384,956 | 1/1995 | Sakurai et al. | 29/834 |
| 5,400,497 | 3/1995 | Watanabe et al. | 29/705 |
| 5,462,446 | 10/1995 | Ikeya | 439/264 |
| 5,657,533 | 8/1997 | Fukui et al. | 29/743 |
| 5,701,821 | 12/1997 | Asai et al. | 101/424 |
| 5,727,409 | 3/1998 | Inoue et al. | 72/21.1 |

FOREIGN PATENT DOCUMENTS

| | | |
|---|---|---|
| B2-3-50438 | 8/1991 | Japan. |
| 3-203251 | 9/1991 | Japan. |

*Primary Examiner*—Lee Young
*Assistant Examiner*—Bobby Rushing, Jr.
*Attorney, Agent, or Firm*—Oliff & Berridge, PLC

[57] ABSTRACT

A mounting head, a mounting apparatus, and a mounting method which are capable of contacting an electronic component with a substrate with a small contact load and mounting the component on the substrate, are provided. A suction device 120 is fit on a splined axis portion 118 of a support shaft 84 via a ball spline 126, is biased downward by a first spring 130, and is biased upward by a second spring 134. A suction nozzle 124 is attached to a nozzle holder 122 by engaging engagement ridges 172 of sheet springs 166 fixed to the suction nozzle 124 with engagement grooves 144 of the nozzle holder 122, respectively. Prior to the mounting of electronic components 178, a relationship between contact load and position of lift 28 is obtained, and a position to which the lift 28 is moved downward for mounting each electronic component 178 is pre-determined. Thus, each component 178 is contacted with a printed circuit board with an appropriate load. Each component 178 is contacted with the circuit board with a small load, by removing the self weight of the suction device 120 owing to the biasing action of the second spring 134 and reducing the frictional resistance produced between the suction device 120 and the axis member 84 owing to the provision of the ball spline 126.

17 Claims, 6 Drawing Sheets

ELECTRONIC-COMPONENT MOUNTING HEAD, ELECTRONIC-COMPONENT MOUNTING APPARATUS, AND ELECTRONIC-COMPONENT MOUNTING METHOD

This is a Division of application Ser. No. 08/627,993 filed Apr. 4, 1996 U.S. Pat. No. 5,758,410.

BACKGROUND OF THE INVENTION

1. Field of the Invention

The present invention relates to an electronic-component mounting head, an electronic-component mounting apparatus, and an electronic-component mounting method and particularly relates to the art of reducing the contact load applied by an electronic component to a substrate when the component is mounted on the substrate.

2. Related Art

In many cases, electronic components are mounted on a substrate, such as a printed circuit board, by using a suction device which applies suction to each electronic component to hold the component and which is movable upward and downward. Thus, an electronic-component mounting apparatus includes (A) a lift member which is moved upward and downward by a lifting device and (B) an electronic-component mounting head which is supported by the lift member. The electronic-component mounting head includes (a) a head frame, (b) a suction device which is supported by the head frame via a bearing such that the suction device is movable upward and downward relative to the head frame and which applies suction to an electronic component to hold the component, and (c) a biasing device which biases the suction device downward, and the head frame is supported by the lift member.

For example, an electronic-component mounting head of an electronic-component mounting apparatus described in Japanese Patent Application laid open under Publication No. 3-203251 includes a head frame, a suction device which is supported by the head frame such that the suction device is movable upward and downward, and a compression coil spring provided between the suction device and the head frame. Thus, the suction device is biased downward by a biasing force equal to the sum of the elastic force of the spring and the weight of the suction device itself. The downward movement of the suction device is limited when the suction device abuts on a stopper provided on the head frame. A sliding bearing, not shown in the drawings, is provided between the suction device and the head frame.

When an electronic component is mounted on a printed circuit board as a substrate, a lift member is further moved downward by a small distance after the component contacts the circuit board. This movement is done for mounting the component on the substrate with reliability, even though the component, the substrate, etc. may have manufacturing errors. Since the compression coil spring is compressed and the relative movement of the head frame and the suction device is permitted, the downward movement of the head frame is permitted even after the component contacts the circuit board. This also applies to the event that an electronic component is held by the suction device.

However, the prior electronic-component mounting apparatus suffer from the problem that it is difficult to reduce the contact load applied by an electronic component to a substrate. When the head frame is further moved downward after the component contacts the substrate, the weight of the suction device and the biasing force of the compression coil spring act on the component. In addition, even if the sliding bearing may be provided between the suction device and the head frame, some sliding resistance is produced between the suction device and the head frame and a force based on this resistance is applied to the component. Thus, it is difficult to sufficiently reduce the contact load (strictly, this load additionally includes the self weight of the component) and accordingly only limited sorts of electronic components can be mounted.

For example, in the case of an electronic component of a sort which is provided by a wafer and a small number (e.g., four) of solder bumps which are formed directly on the wafer and each of which has very small dimensions (e.g., 0.1 mm diameter and 0.1 mm height), it is needed to reduce the contact load to not more than 4 g, providing that at most 1 g can be applied to each solder bump. However, generally, the weight of a suction device is more than 4 g and accordingly this specific sort of electronic component cannot be mounted on a printed circuit board.

SUMMARY OF THE INVENTION

The object of the present invention is to provide an electronic-component mounting head which is capable of mounting an electronic component with a small contact load; another object of the present invention is to provide an electronic-component mounting head which is capable of mounting an electronic component with a small contact load and which includes a suction nozzle which applies suction to the electronic component to hold the component and which can be replaced with another suction nozzle; yet another object of the present invention is to provide an electronic-component mounting apparatus which moves a suction device downward to a pre-determined position where an electronic component is mounted with an appropriate contact load; and yet another object of the present invention is to provide an electronic-component mounting method which includes the step of moving a suction device downward to a pre-determined position where an electronic component is mounted with an appropriate contact load.

According to the present invention, there is provided an electronic-component mounting head including a head frame, a suction device which is supported by the head frame via a bearing such that the suction device is movable upward and downward relative to the head frame and which applies suction to an electronic component to hold the component, and a first biasing device which biases the suction device downward, wherein the bearing comprises a rolling bearing and a second biasing device which biases the suction device upward is provided between the head frame and the suction device.

In the electronic-component mounting head in accordance with the present invention, since the suction device is supported by the head frame via the rolling bearing, only a very small frictional resistance is produced when the suction device is moved relative to the head frame. Thus, the influence of the frictional resistance to the contact load applied by the electronic component to a substrate is made negligible or at least smaller.

In addition, when the electronic component is mounted on the substrate, the head frame and the substrate are further moved relative to each other in a direction toward each other after the component contacts the substrate. This relative movement is permitted by the movement of the suction device relative to the head frame against the difference of respective biasing forces of the first and second biasing devices. Thus, a contact load whose magnitude corresponds to the difference of the two biasing forces is applied to the component.

For example, the first biasing device may be provided by the self weight of the suction device and the second biasing device may be provided by an elastic member which is disposed between the suction device and the head frame and which biases the suction device upward. In this case, a first biasing force is equal to the sum of the self weight of the suction device and the self weight of the electronic component (in many cases, the self weight of the electronic component is negligible), and a second biasing force is equal to the elastic force of the elastic member.

Otherwise, the first biasing device may be provided by a first elastic member which is disposed between the head frame and the suction device and which biases the suction device downward, and the self weight of the suction device, and the second biasing device may be provided by a second elastic member which is disposed between the suction device and the head frame and which biases the suction device upward. In this case, the first biasing force is equal to the sum of the elastic force of the first elastic member, the self weight of the suction device, and the self weight of the electronic component (in many cases, the self weight of the electronic component is negligible), and the second biasing force is equal to the elastic force of the second elastic member.

In either of the above-described two cases, in a state before the electronic component contacts the substrate, the first and second biasing forces may be balanced by each other, or the first biasing force may be greater than the second biasing force so that the suction device may be held in pressed contact with a stopper with a pressing force equal to the difference of the first and second biasing forces. In the latter manner, in the state before the component contacts the substrate, the vibration of the suction device in a vertical direction is easily prevented, and the position of the suction device relative to the head frame is easily maintained with accuracy. In the latter case, too, when the head frame and the suction device are moved relative to each other in the direction toward each other after the component contacts the substrate, the suction device is moved away from the stopper and accordingly the contact load applied by the component to the substrate is equal to the difference of the first and second biasing forces.

In the case where the first biasing device is provided by the self weight of the suction device only, the self weight of the suction device may partly be negated by the biasing force of the second biasing device, so that the contact load applied by the electronic component to the substrate may be smaller than the sum of respective self weights of the suction device and the component.

In the case where the first biasing device is provided by the self weight of the suction device and the first elastic member, the contact load applied by the electronic component to the substrate may be made smaller or greater than the sum of respective self weights of the suction device and the component, depending upon a selected biasing force of the second biasing device.

In the case where different sorts of electronic components are mounted on a substrate with different contact loads, respectively, it is preferred that at least one of the first and second biasing devices be provided by a variable biasing device whose biasing force is variable. In this case, at least one of the first and second biasing devices may be provided by a variable biasing device including a variable biasing element whose biasing force is variable. The variable biasing element may be an external-type variable biasing element, such as the above-described elastic member, whose biasing force is varied when an external factor, such as the position of the suction device relative to the head frame, is changed. Otherwise, the variable biasing element may be an internal-type variable biasing element, such as a solenoid or a diaphragm-type air cylinder, whose biasing force is varied when an internal factor, such as an electric current or an air pressure supplied to the element, is changed, without needing the change of any external factor such as the position of the suction device relative to the head frame. Thus, the contact load applied by the electronic component to the substrate can be controlled by controlling the external or internal factor. However, a solenoid or a diaphragm-type air cylinder may be used as an external-type variable biasing element, in the case where the solenoid or cylinder is provided between the suction device and the head frame and an internal factor, such as electric current or amount of enclosed air, is kept constant. In this case, the biasing force can be changed by changing the relative position of the suction head and the head frame.

In the case where the contact load is largely variable, it is preferred that the first and/or second biasing device include one of a plurality of sorts of variable biasing elements which have different variable-biasing-force ranges and which can be replaced with each other. If a variable biasing element of a sort which has a variable-biasing-force range suitable for an electronic component of a sort which is appropriately contacted with a high contact load, is used for mounting an electronic component of a sort which is appropriately contacted with a low contact load, the electronic component of the latter sort may be contacted with an excessively large contact-load error. On the other hand, if a variable biasing element of a sort which has a variable-biasing-force range suitable for mounting an electronic component of a sort which is appropriately contacted with a low contact load, is used for mounting an electronic component of a sort which is appropriately contacted with a high contact load, it may be difficult to provide a sufficiently large biasing force suitable for mounting the electronic component of the latter sort.

As is apparent from the foregoing description, the electronic-component mounting head in accordance with the present invention can contact an electronic component with a substrate, with a small load, when mounting the component on the substrate. In addition, when the suction device holds the component by suction, the suction device can be contacted with the component, with a small load, because the self weight of the suction device is partly negated by the second biasing device as described above. Thus, the suction device can hold an electronic component which has the nature of easily be damaged, without damaging it.

In an embodiment of the present invention, the suction device includes a nozzle holder which is supported by the head frame such that the nozzle holder is movable upward and downward relative to the head frame and which is biased by the first and second biasing devices in opposite directions, respectively, a suction nozzle, and an attaching device for attaching the suction nozzle to the nozzle holder such that the suction nozzle attached to the nozzle holder is detachable from the nozzle holder.

In the electronic-component mounting head in accordance with this embodiment, when it is needed to replace the current suction nozzle with another suction nozzle because the former nozzle has been damaged or because the current sort of electronic components are changed to another sort of electronic components, the attaching device is used for detaching the former nozzle from the nozzle holder and attaching the latter nozzle to the holder.

The mounting head in accordance with this embodiment enjoys not only the advantages of the invention but also the advantage that the suction nozzle can be replaced with another suction nozzle.

In another embodiment of the present invention, the rolling bearing comprises a ball spline.

In the electronic-component mounting head in accordance with this embodiment, owing to the rolling bearing, the frictional resistance produced when the suction device is moved relative to the head frame is reduced and the rotation of the suction device relative to the head frame is prevented. Thus, the bearing which reduces the frictional resistance produced when the suction device and the head frame are moved relative to each other, also functions as a relative-rotation preventing device which prevents the relative rotation of the suction device and the head frame. Accordingly, the present mounting head enjoys a simple construction. However, the relative-rotation preventing device may be provided independent of the rolling bearing. For example, the rolling bearing and a ball spline may be provided at two locations, respectively, which are distant from each other in an axial direction of the suction device.

In yet another embodiment of the present invention, each of the first and second biasing devices includes a compression coil spring.

In yet another embodiment of the present invention, the attaching device includes a relative-rotation preventing device which prevents the suction nozzle from rotating relative to the nozzle holder.

The electronic-component mounting head in accordance with this embodiment enjoys not only the advantage that the suction nozzle can be replaced with another suction nozzle but also the advantage that the relative-rotation preventing device prevents the rotation of the suction nozzle relative to the nozzle holder. For example, when the mounting head is moved, the suction nozzle is prevented from rotating relative to the nozzle holder and, after the electronic component is held by suction by the suction nozzle, the component held by the nozzle is prevented from moving out of position about an axis line of the suction device.

In yet another embodiment of the present invention, the relative-rotation preventing device includes one pair out of a pair of engageable grooves which extend parallel to each other in a direction perpendicular to an axis line of the nozzle holder and a pair of engageable ridges which are engageable with the pair of engageable grooves, respectively, the one pair being provided on the nozzle holder, the preventing device additionally including a pair of sheet springs which are provided on the suction nozzle and which have respective end portions providing the other pair out of the pair of engageable grooves and the pair of engageable ridges.

While the engageable grooves and the engageable ridges are engaged with each other, the sheet springs are elastically deformed so that the engagement of the engageable grooves and ridges is maintained with stability.

In yet another embodiment of the present invention, the pair of engageable ridges are provided by respective bent end portions of the pair of sheet springs which are bent to project toward an axis line of the component suction nozzle.

In the electronic-component mounting head in accordance with this embodiment or the preceding embodiment, the engageable grooves and ridges of the nozzle holder and the sheet springs are engaged with each other, so that the suction nozzle is held by the nozzle holder and the relative rotation of the two elements is prevented. Thus, the present mounting head includes the attaching device which is easily used for attaching and detaching the suction nozzle to and from the nozzle holder and which also functions as the rotation preventing device. Accordingly the mounting head enjoys a simple construction and a low production cost.

In yet another embodiment of the present invention, the nozzle holder includes one of a cylindrical recess and a cylindrical projection which is fitable in the cylindrical recess, and the suction nozzle includes the other of the cylindrical recess and the cylindrical projection.

The fitting of the cylindrical projection in the cylindrical recess assures the concentricity of the suction nozzle and the nozzle holder.

In yet another embodiment of the present invention, at least one pair out of the pair of engageable grooves and the pair of engageable ridges have respective inclined surfaces which are inclined such that upper portions thereof are nearer to the axis line of the nozzle holder than lower portions thereof, the inclined surfaces being engageable with the other pair out of the pair of engageable grooves and the engageable ridges, respectively.

Owing to the inclined surfaces, the elastic forces of the sheet springs are converted into forces which draw the suction nozzle toward the nozzle holder, so that the nozzle is held by the holder with stability.

In yet another embodiment of the present invention, the bent end portions of the pair of sheet springs have respective inclined surfaces which are inclined such that upper portions thereof are nearer to the axis line of the nozzle holder than lower portions thereof, the inclined surfaces of the bent end portions being engageable with the engageable grooves, respectively.

In the electronic-component mounting head in accordance with this embodiment, the inclined surfaces which are necessarily produced when the bent end portions of the sheet springs are produced, function as the engageable ridges which are engageable with the engageable grooves. Thus, those inclined surfaces are easily produced.

In yet another embodiment of the present invention, the cylindrical projection has an outer tapered surface and the cylindrical recess has an inner tapered surface, the outer tapered surface of the cylindrical projection being fitable in the inner tapered surface of the cylindrical recess.

In the electronic-component mounting head in accordance with this embodiment, the diameter of the cylindrical projection decreases according to the outer tapered surface thereof, and the degree of inclination of the inner tapered surface corresponds to that of the outer tapered surface. As will be described later, the elastic forces of the sheet springs cooperate with the inclined surfaces to draw the suction nozzle toward the nozzle holder, so that the inner and outer tapered surfaces are held in pressed contact with each other. Thus, the concentricity of the suction nozzle with respect to the nozzle holder is assured.

In the case where the cylindrical projection or recess does not have the inner or outer tapered surface, it is preferred that the suction nozzle and the nozzle holder be provided with respective contact surfaces which are held in pressed contact with each other because of the drawing forces resulting from the elastic forces of the sheet springs and the effects of the inclined surfaces. It is possible that the relative position of the suction nozzle and the nozzle holder in the axial direction be defined by only the engagement of the engageable grooves and ridges. However, if those contact surfaces are employed, the suction nozzle and the nozzle holder are positioned relative to each other with higher accuracy.

In yet another embodiment of the present invention, the electronic-component mounting head further comprises a vibration preventing device which prevents vibration of the suction device relative to the nozzle holder.

In yet another embodiment of the present invention, the vibration preventing device includes a stopper which defines a limit of movement of the suction device in a direction in which the suction device is biased by the first biasing device.

In the electronic-component mounting head in accordance with this embodiment, since the movement of the suction device in the direction in which the suction device is biased by the first biasing device, is limited by the stopper, the vibration of the suction device is prevented. Unless the inertia force of the suction device in the upward direction overcomes the pressing force to pressing the suction device against the stopper, the suction device does not move away from the stopper. Thus, the vibration of the suction device is prevented. When an electronic component is held by suction by the suction device, or mounted on a substrate by the suction device, the suction device is moved away from the stopper and a biasing force corresponding to the difference of respective biasing forces of the first and second biasing devices is applied to the suction device.

In yet another embodiment of the present invention, the head frame includes a support shaft which has a negative-pressure passage extending in an axial direction thereof and opening in a lower end thereof, and the suction device is externally fit on the support shaft via the rolling bearing.

In the electronic-component mounting head in accordance with this embodiment or the following embodiment, the negative pressure is easily supplied to the suction device.

In yet another embodiment of the present invention, the suction device has a container-like shape which surrounds a lower end portion of the support shaft, and a space between the suction device and a portion of the support shaft located in an inner space of the suction device is airtightly sealed with an elastically deformable sealing member whose one end is fixed to the suction device and whose other end is fixed to the support shaft.

In this embodiment, the space between the support shaft and the suction device can be sealed without using, as a sealing member, an O-ring or a mechanical seal which naturally involves the production of frictional force. This sealing is needed for not only assuring the negative pressure of the suction device and but also preventing dust from entering, with air, the rolling bearing provided between the suction device and the support shaft.

In yet another embodiment of the present invention, the sealing member includes a bellows which is externally fit on the portion of the support shaft located in the inner space of the suction device, whose upper end is airtightly fixed to the suction device, and whose lower end is airtightly fixed to the support shaft.

In yet another embodiment of the present invention, the second spring includes a compression coil spring which is provided outside the bellows.

In this embodiment, the compression coil spring prevents the bellows from being deformed because of the difference of respective pressures inside and outside the bellows.

The bellows may be formed integrally with the compression coil spring.

In yet another embodiment of the present invention, the suction device includes a nozzle holder which is fit on the support shaft via the rolling bearing, and a suction nozzle which is attached to the nozzle holder such that the suction nozzle is detachable from the nozzle holder, and a space between the suction nozzle and the nozzle holder is airtightly sealed with a sealing device which is provided between the suction nozzle and the nozzle holder.

In yet another embodiment of the present invention, the suction nozzle includes a container-like portion with a bottom wall, and a suction pipe which extends downward from the bottom wall of the container-like portion, the suction nozzle being attached to the nozzle holder such that a portion of the support shaft which projects downward from the nozzle holder is located in the container-like portion of the suction nozzle.

In this embodiment, the elastic member or the sealing member may be assembled with the support shaft, under the condition that the suction nozzle has been detached, and is absent, from the support shaft.

According to the present invention, there is provided an electronic-component mounting apparatus including a lift member which is moved upward and downward by a lifting device, an electronic-component mounting head, the head frame of the mounting head being supported by the lift member, a contact-load detecting device which detects a contact load applied by an electronic component to a substrate on which the component is to be mounted, a relative-position detecting device which detects a position of the suction device of the mounting head relative to the head frame thereof, and a downward-movement control device which controls the lifting device to move the lift member downward to a position determined based on the contact load detected by the contact-load detecting device, the relative position detected by the relative-position detecting device, and a target contact load.

In the electronic-component mounting apparatus in accordance with the present invention, before an electronic component is mounted on a substrate, a relationship between the contact load applied by the electronic component to the substrate and the position of the suction device relative to the head frame is obtained and, based on the obtained relationship and a target contact load, a position to which the lift member is moved downward is determined. The suction device is biased by the first and second biasing devices and accordingly can contact the electronic component with the substrate with a contact load smaller than the sum of respective self weights of the suction device and the component, as needed. However, usually, the biasing force of at least one of the first and second biasing devices of a mounting head is different from that of another mounting head. Therefore, the relative position of the suction device and the head frame, i.e., amount of downward movement of the lift member which corresponds to the target contact load will change with different mounting heads.

The obtained relationship between the contact load and the relative position can be utilized for determining the amount of downward movement of the lift member which corresponds to the target contact load that is not so great as to damage the electronic component and is sufficiently great to contact the component with the substrate.

The position to which the lift member is moved downward may automatically be determined by the present electronic-component mounting apparatus, as described later, or determined by an operator. In the former case, the mounting apparatus is provided with position determining means for determining a position to which the lift member is moved downward, based on a detected contact load and a detected relative position. In the latter case, the mounting apparatus is provided with an input device which is operable by the operator for inputting the determined position, and a memory which stores the input position.

The electronic-component mounting apparatus in accordance with the present invention can contact an electronic component with a substrate with an appropriate and small contact load.

According to the present invention, there is provided a method of mounting an electronic component on a substrate by using an electronic-component mounting head including a suction device which is supported by a head frame via a bearing such that the suction device is movable upward and downward relative to the head frame and such that the suction device is biased downward by a first biasing device and is biased upward by a second biasing device, wherein the method includes the steps of determining, prior to the mounting of the electronic component on the substrate, a relationship between the position of the suction device relative to the head frame and the contact load applied by the electronic component to the substrate, determining, based on the determined relationship, a position to which the head frame is to be moved downward, operating the suction device to apply suction to the electronic component to hold the component, and moving the head frame downward to the determined position where the electronic component is mounted on the substrate.

In the electronic-component mounting method in accordance with the present invention, before the mounting of an electronic component on a substrate is started, a position to which the head frame is moved downward is determined, and the electronic component is mounted on the substrate with an appropriate contact load.

In the electronic-component mounting method in accordance with the present invention, an electronic component can be contacted with a substrate with an appropriate and small contact load.

EMBODIMENTS

Figure 1:
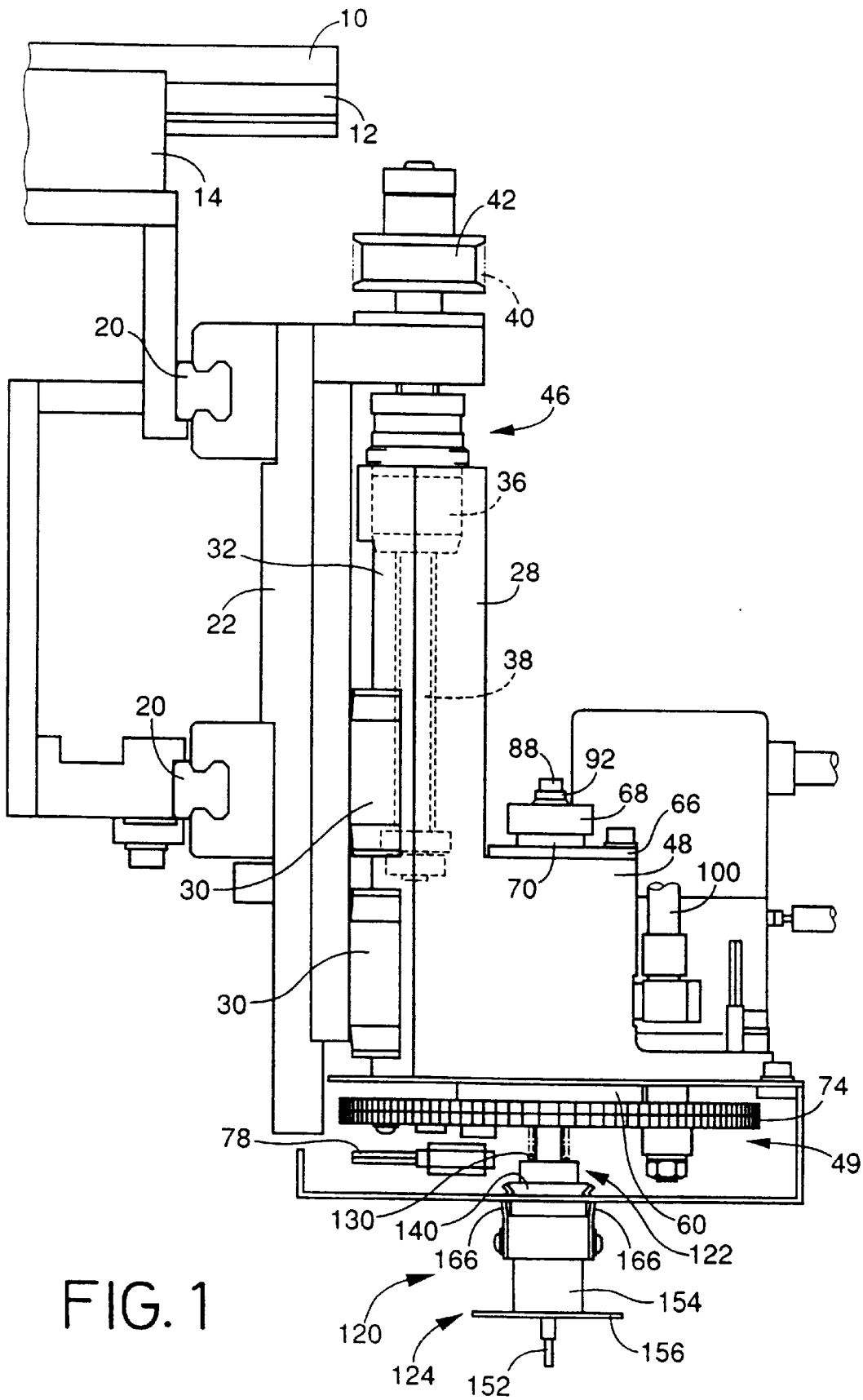
FIG. 1 is a front view of an electronic-component mounting apparatus which is provided as one embodiment of the present invention, which includes an electronic-component mounting head as one embodiment of the present invention, and which carries out an electronic-component mounting method as one embodiment of the present invention.

Referring to the drawing, there will be described embodiments of the present invention in detail.

Figure 4:
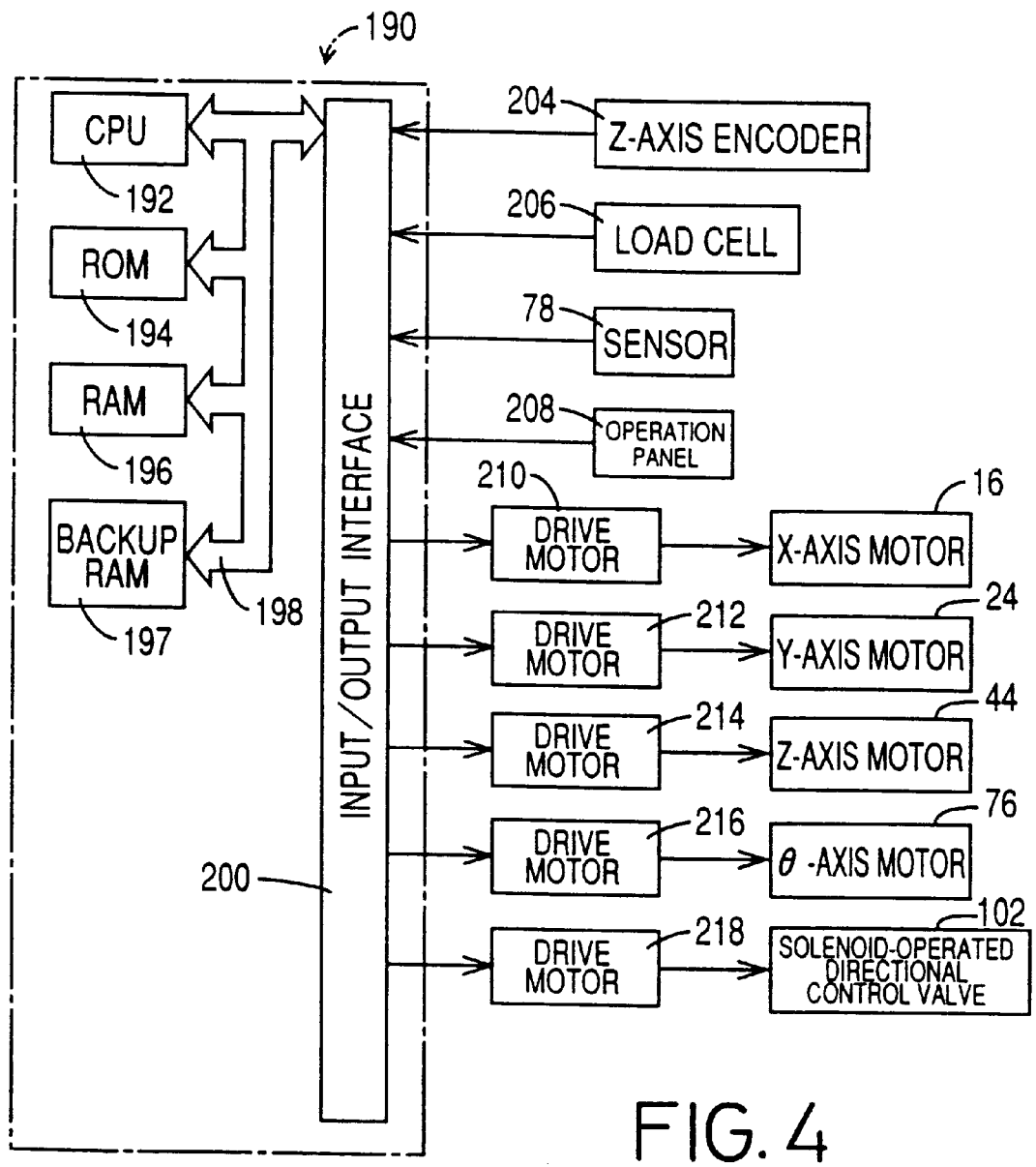
FIG. 4 is a diagrammatic view of a control device of the electronic-component mounting apparatus.

In FIG. 1, reference numeral 10 designates a frame. A guide rail 12 is fixed to the frame 10 such that the rail 12 extends parallel to x-axis directions (i.e., rightward and leftward directions in FIG. 1). An x-axis slide 14 is fit on the guide rail 12 such that the slide 14 is movable relative to the rail 12. The x-axis slide 14 is moved in the x-axis directions by an x-axis moving device, while being guided by the guide rail 12. The x-axis moving device includes a nut (not shown) fixed to the slide 14, a ball screw supported by the frame 10 such that the ball screw is rotatable relative to the frame 10 and is immovable in an axial direction thereof relative to the frame 10, and an x-axis motor 16 (FIG. 4).

A pair of guide rails 20 each of which extends parallel to y-axis directions that are perpendicular to the x-axis directions in a horizontal plane, is fixed to the x-axis slide 14. A y-axis slide 22 is fit on the guide rails 20 such that the slide 22 is movable relative to the rails 20. The y-axis slide 22 is moved in the y-axis directions by a y-axis moving device, while being guided by the guide rails 20. The y-axis moving device includes a nut (not shown) fixed to the slide 22, a ball screw supported by the x-axis slide 14, and a y-axis motor 24 (FIG. 4).

The y-axis slide 22 has a shape like a thick plate, and is supported by the guide rails 20 such that the slide 22 projects vertically downward from the rails 20. A lift 28 is supported by a front portion of the slide 22 such that the lift 28 is movable upward and downward. Two pairs of upper and lower guide blocks 30 are fixed at two locations on the front portion of the y-axis slide 22, respectively, which are distant from each other in the y-axis directions. Two guide rails 32 (only one is shown in FIG. 1) which are fixed to a back surface of the lift 28 such that the rails 32 extend vertically, are fit in the two pairs of guide blocks 30, respectively.

A nut 36 is fixed to a portion of the lift 28 which is between the two guide rails 32, and is threadedly engaged with a ball screw 38 which is fixed to the front portion of the y-axis slide 22 such that the screw 38 extends vertically. The ball screw 38 is supported by the slide 22 such that the screw 38 is rotatable relative to the slide 22 and is immovable in an axial direction thereof relative to the slide 22. The screw 38 is rotated by a z-axis motor 44 (see FIG. 4) via a timing belt 40 and a timing pulley 42, shown in FIG. 1, and another timing pulley (not shown), so that the lift 28 is moved upward and downward. The ball screw 38, the timing belt 40, the timing pulley 42, the z-axis motor 44, etc. cooperate with one another to provide a lifting device which moves the lift 28 upward and downward.

Figure 2:
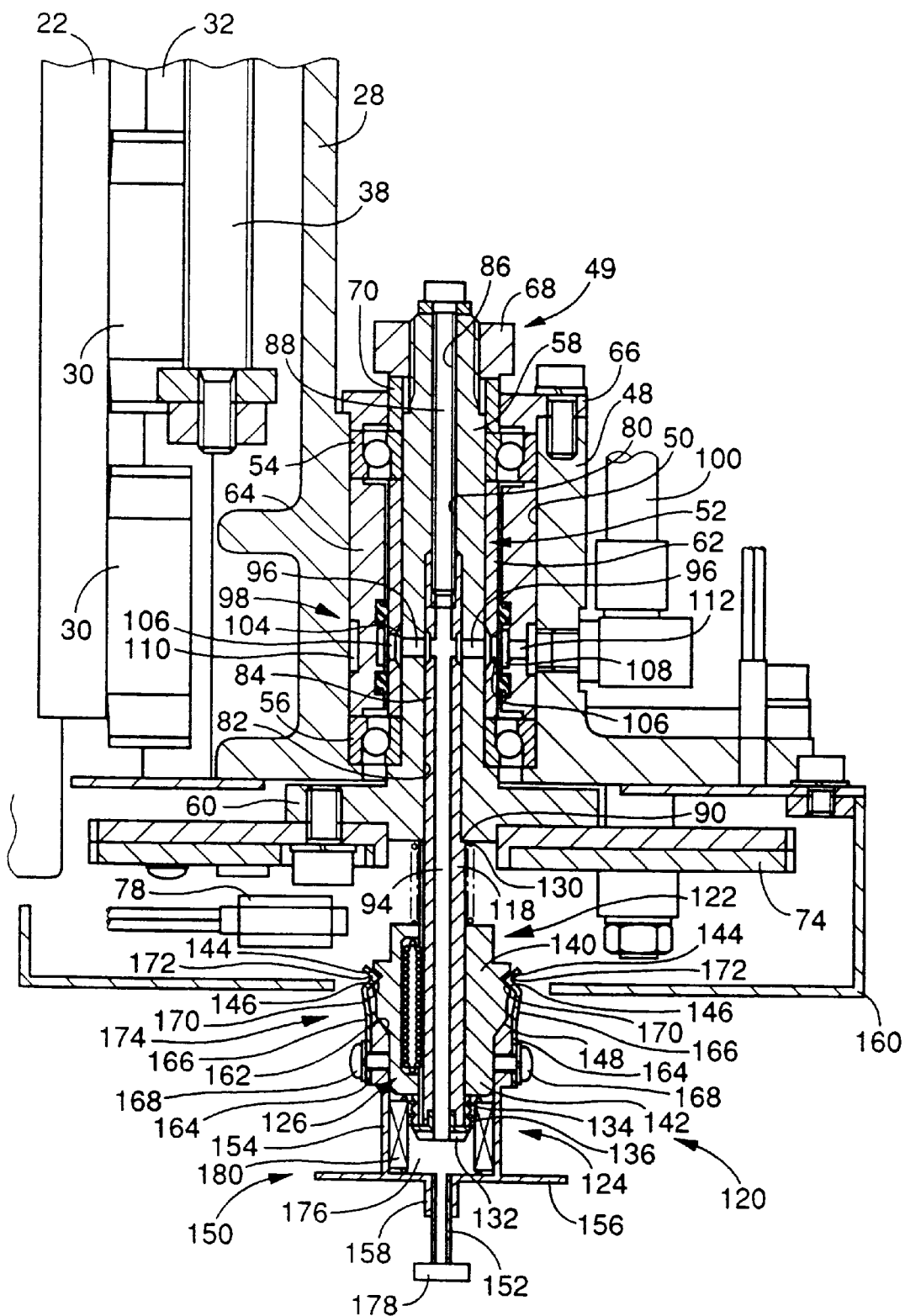
FIG. 2 is a front cross-section view of the electronic-component mounting apparatus.

A lower portion of the lift 28 projects frontward and, as shown in FIG. 2, this projecting portion 48 supports an electronic-component mounting head 49. A vertical through-hole 50 is formed through the projecting portion 48, and a rotatable member 52 of the mounting head 49 is fit in the through-hole 50 via two bearings 54, 56 such that the rotatable member 52 is rotatable about a vertical axis line. The rotatable member 52 includes an axis portion 58 having a small diameter, and an attachment portion 60 which extends like a flange from a lower end of the axis portion 58. The axis portion of the rotatable member 52 is fit in the through-hole 50.

Two cylindrical retainers 62, 64 are provided between the two bearings 54, 56, and a cap 66 is fixed to the projecting portion 48. With a nut 68 being threadedly engaged with the axis portion 58, a spacer 70 is pressed against the upper bearing 54, so that the rotatable member 52 is positioned in an axial direction thereof, inside the through-hole 50. In addition, a preload is given to the balls of the bearings 54, 56, which create negative clearances in the bearings 54, 56.

A driven gear wheel 74 of a type which is provided by a combination of two gear wheels and which is free from backlash, is fixed to a lower surface of the attachment portion 60 of the rotatable member 52. The driven gear wheel 74 is engaged with a drive gear wheel (not shown)

fixed to an output shaft of a θ-axis motor 76 (see FIG. 4) and, when the gear wheel 74 is rotated by the motor 76, the rotatable member 52 is rotated about the vertical axis line. Since no backlash is produced between the drive gear wheel and the driven gear wheel 74, the rotation of the motor 76 is transmitted with accuracy to the rotatable member 52. Reference numeral 78 designates a sensor which detects an original position of the rotatable member 52 or the θ-axis motor 76.

The rotatable member 52 has a stepped through-hole 80 extending along an axis line thereof. The stepped through-hole 80 includes a large-diameter hole 82 which opens in the lower surface of the attachment portion 60 and in which a small-diameter portion of a support shaft 84 is fit. The through-hole 80 also includes a small-diameter hole 86 which opens in an upper surface of the axis portion 58 and in which a bolt 88 is inserted. A lower end portion of the bolt 88 being inserted in the small-diameter hole 86 is threadedly engaged with the small-diameter portion of the support shaft 84 being fit in the large-diameter hole 82. The support shaft 84 is displaced upward by the bolt 88, and a shoulder surface 90 provided between the small-diameter and large-diameter portions thereof is pressed against the lower surface of the attachment portion 60 around the opening of the large-diameter hole 82. Thus, the support shaft 84 is fixed to the rotatable member 52 such that the shaft 84 is not movable in an axis direction thereof, or rotatable, relative to the rotatable member 52.

A passage 94 extends through the support shaft 84 along an axis line thereof. The passage 94 is connected to a negative-pressure supplying source, not shown, via radial passages 96 formed through the axis portion 58, a rotatable coupling 98, a hose 100, and a solenoid-operated directional control valve 102 (FIG. 4). The rotatable coupling 98 includes an annular passage 104 and radial passages 106 which are formed in the retainer 62, and annular passages 108, 110 and radial passages 112 which are formed in the retainer 64. The coupling 98 ensures that the negative pressure can be supplied to the passage 94 irrespective of which rotational position is currently taken by the rotatable member 52 relative to the projecting portion 48 of the lift 28. The supplying of the negative pressure to the passage 94 and the stopping of the supplying are controlled by the solenoid valve 102.

The large-diameter portion of the support axis member 84 which projects from the rotatable member 52 provides a splined axis portion 118 which supports a suction device 120. The suction device 120 includes a nozzle holder 122 and a suction nozzle 124 held by the nozzle holder 122. A ball spline 126 is provided in the nozzle holder 122, which is splinedly engaged with the splined axis portion 118. In FIG. 2, the ball spline 126 is schematically illustrated and, in fact, the nozzle holder 122 is provided by a plurality of members which hold the balls of the ball spline 126.

Figure 3:
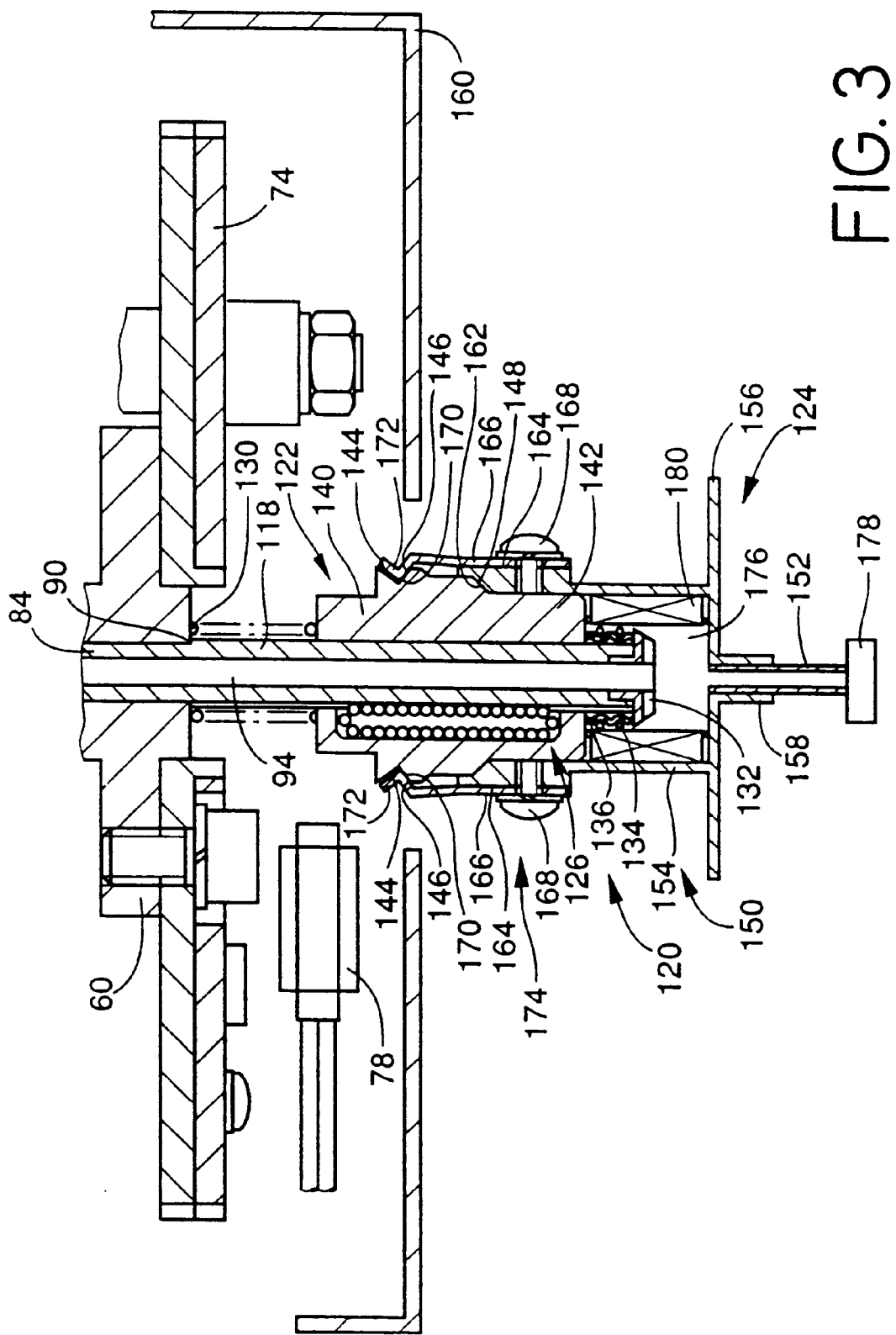
FIG. 3 is an enlarged, front cross-section view of a suction device of the electronic-component mounting apparatus.

As shown in FIG. 3, a first compression coil spring 130 (hereinafter, referred to as "the first spring 130") is fit on a portion of the splined axis portion 118 which is between the nozzle holder 122 and the attachment portion 60 of the rotatable member 52, and a second compression coil spring 134 (hereinafter, referred to as "the second spring 134") is fit on a portion of the splined axis portion 118 which is between the nozzle holder 122 and a spring seat 132 fixed to a lower end of the axis portion 118. The second spring 134 is provided outside a bellows 136 which is formed of rubber, whose one end is airtightly connected to the nozzle holder 122 and whose other end is airtightly connected to the spring seat 132.

The biasing force of the first spring 130 and the weight of the suction device 120 are applied to the second spring 134 and the bellows 136. With no other external force being applied to the suction device 120, the suction device 120 is kept still at a position where a first biasing force provided by the elastic force of the first spring 130 and the self weight of the suction device 120 is balanced by a second biasing force provided by the respective elastic forces of the second spring 134 and the bellows 136. In this state, none of the first spring 130, the second spring 134, and the bellows 136 does not collapse under the load applied thereto. The respective load characteristics of those elements 130, 134, 134 are so pre-determined as to ensure that.

An upper portion of the nozzle holder 122 provides an attachment portion 140 having a quadrangular cross section, and a lower portion of the same 122 provides a cylindrical projection 142. The attachment portion 140 has a pair of parallel engagement grooves 144 which open in side surfaces thereof and have a triangular cross section and which extend in a direction perpendicular to the axis line of the nozzle holder 122. The two engagement grooves 144 have respective inclined surfaces 146 which are inclined such that upper portions thereof are nearer to the axis line of the nozzle holder 122 than lower portions thereof. In addition, the attachment portion 140 has, between the attachment portion 140 and the cylindrical projection 142, an outer tapered surface 148 which is tapered such that lower portions thereof have smaller diameters than those of upper portions thereof.

The suction nozzle 124 includes a suction pipe 152, and a cylindrical suction-pipe holder 150 having a bottom wall for holding the suction pipe 152. The bottom wall of the pipe holder 152 provides a back plate 156 having a larger diameter than that of a cylindrical portion 154 of the pipe holder 152. A lower surface of the back plate 156 is black and coarse and effectively absorbs the light incident thereto. A cylindrical suction-pipe holding projection 158 projects downward from a central portion of the back plate 156, and the suction pipe 152 is fit in the projection 158. Reference numeral 160 designates another back plate which serves for large-size electronic components. The back plate 160 is fixed to the lift 28.

An upper end portion of an inner surface of the cylindrical portion 154 of the suction-pipe holder 150 provides an inner tapered surface 162 which corresponds to the outer tapered surface 148 of the nozzle holder 122. Two attachment surfaces 164 which are parallel to the axis line of the suction nozzle 124 are formed at two locations on an outer surface of an upper portion of the cylindrical portion 154 that are diametrically opposite to each other. Two sheet springs 166 are fixed to the two attachment surfaces 164 with screws 168, respectively, such that the springs 166 project upward from the cylindrical portion 154. Respective upper end portions of the two sheet springs 166 are bent to have a V-shaped cross section, thereby providing two engagement ridges 172 having respective engagement surfaces 170 which are inclined such that upper portions thereof are nearer to the axis line of the suction nozzle 124 than lower portions thereof.

The cylindrical portion 154 of the suction nozzle 124 is fit on the cylindrical projection 142 of the nozzle holder 122, in such a manner that first the two sheet springs 166 are elastically deformed outward and then the engagement ridges 172 are engaged with the engagement grooves 144. With the engagement ridges 172 being engaged with the engagement grooves 144, the sheet springs 166 are kept elastically deformed outward, so that the elastic deformation of the springs 166 results in elastically pressing the engagement surfaces 170 against the inclined surfaces 146. Owing to the inclination of the surfaces 146, the elastic force of the springs 166 to press the engagement surfaces 170 on the inclined surfaces 146 is converted into a force which is applied to the suction nozzle 124 in a direction in which the suction nozzle 124 is secured to the nozzle holder 122. Thus, the inner tapered surface 162 of the suction nozzle 124 is tightly fit on the outer tapered surface 148 of the nozzle holder 122. In this way, the movement of the suction nozzle 124 relative to the nozzle holder 122 in directions perpendicular the axis line of the holder 122 is prevented with reliability, and the concentricity of the two elements 122, 124 is assured with high accuracy. With the inner tapered surface 162 being tightly fit on the outer tapered surface 148, the suction nozzle 124 is positioned relative to the nozzle holder 122 in an axial direction of the holder 122. Moreover, owing to the engagement of the engagement ridges 172 of the sheet springs 166 with the engagement grooves 144 that extend perpendicularly to the axis line of the holder 122, the rotation of the suction nozzle 124 relative to the nozzle holder 122 is prevented. Thus, the suction nozzle 124 is attached to the nozzle holder 122 such that the former 124 is immovable relative to the latter 122 in all directions and the former 124 is positioned with high accuracy in all directions. The sheet springs 166 with the engagement ridges 172 and the engagement grooves 144 of the nozzle holder 122 cooperate with each other to provide not only a nozzle holding device but also a nozzle-rotation preventing device.

A negative-pressure chamber 176 is provided between the cylindrical projection 142 and the suction-pipe holder 150, under the condition that the suction nozzle 124 is attached to the nozzle holder 122. When the negative pressure is supplied from the passage 94 of the support shaft 84 to the suction pipe 152, the suction pipe 152 attracts an electronic component 178 by air suction. A sealing device 180 is provided in the negative-pressure chamber 176 to maintain the airtightness between the pipe holder 150 and the cylindrical projection 142. Meanwhile, the previously-described bellows 136 maintains the airtightness between the cylindrical projection 142 and the splined axis portion 118. In particular, the bellows 136 permits the nozzle holder 122 to lightly move relative to the splined axis portion 118, and prevents dust or the like from entering, with air, the ball spline 126.

The present electronic-component mounting apparatus is controlled by a control device 190 shown in FIG. 4. The control device 190 is essentially provided by a computer including a CPU 192, a ROM 194, a RAM 196, a backup RAM 197, and bus 198 connecting those elements 192, 194, 196, 197, 198 with one another. The previously-described sensor 78, a Z-axis encoder 204 for detecting a rotational position of the Z-axis motor 44, a load cell 206, an operation panel 208, etc. are connected to an input/output interface 200 connected to the bus 198, so that the detection signals produced by those elements 78, 204, 206, 208 are supplied to the interface 200. The Z-axis encoder 204 is an absolute encoder. The load cell 206 detects a contact load applied by the electronic component 178 to a printed circuit board as a substrate on which the component 178 is mounted. The load cell 206 is provided at a contact-load detecting position different from an electronic-component supplying position and an electronic-component mounting position.

The previously-described X-axis motor 16, Y-axis motor 24, Z-axis motor 44, θ-axis motor 76, solenoid-operated directional control valve 102, etc. are also connected to the input/output interface 200 via drive circuits 210, 212, 214, 216, 218, respectively. The ROM 194 stores various programs including a program needed for mounting electronic components 178 on the printed circuit board, and a program needed for detecting the contact load applied by an electronic component 178 to the circuit board and determining a position to which the lift 28 is moved downward.

In the electronic-component mounting apparatus constructed as described above, before the mounting of electronic components 178 on the printed circuit board is started, a relationship between contact load and position of lift 28 is obtained and, based on the obtained relationship and a target contact load, a position to which the lift 28 is moved downward when the suction device 120 takes each component 178 from an electronic-component supplying apparatus, and a position to which the lift 28 is moved downward when the suction device 120 mounts each component 178 on the circuit board are determined.

First, the operation panel 208 is operated so that the suction device 120 applies suction to an electronic component 178 to hold the component 178 and is moved to the contact-load detecting position where the suction device 120 is moved downward. It is preferred that the lift 28 be moved downward at a sufficiently low speed in at least a time period just before the component 178 held by the suction device 120 contacts the load cell 206, so that when the component 178 contacts the load cell 206, the contact load is prevented from excessively increasing due to the inertia force of the suction device 120. The lift 28 is further moved downward after the component 178 contacts the load cell 206. This downward movement of the lift 28 is permitted because the first spring 130 is compressed and the suction device 120 and the rotatable member 52 are moved relative to each other. In addition, the friction produced in the ball spline 126 is very small and negligible. Thus, the electronic component 178 is contacted with the load cell 206 with a contact load which is equal to a biasing-force difference obtained by subtracting, from the first biasing force provided by the elastic force of the first spring 130 and the self weight of the suction device 120, the second biasing force provided by the respective elastic forces of the second spring 134 and the bellows 136.

During the above-described downward movement of the lift 28, the control device 190 executes various programs for iteratively calculating the positions of the lift 28 (i.e., distances of downward movement of the lift 28 from the position of origin), based on the output signals supplied from the Z-axis encoder 204, and iteratively calculating the contact loads based on the output signals supplied from the load cell 206. After the electronic component 178 contacts the load cell 206 and the contact load starts to increase from zero, the control device 190 reads and stores, in the backup RAM 197 (preferably provided by a programmable non-volatile memory; otherwise, the backup RAM 197 may be changed with an external memory such as a floppy disk or a hard disk), a current contact load each time the lift 28 is moved downward by unit distance, such that each contact load is related with a current position of the lift 28 when that contact load is detected.

Figure 5:
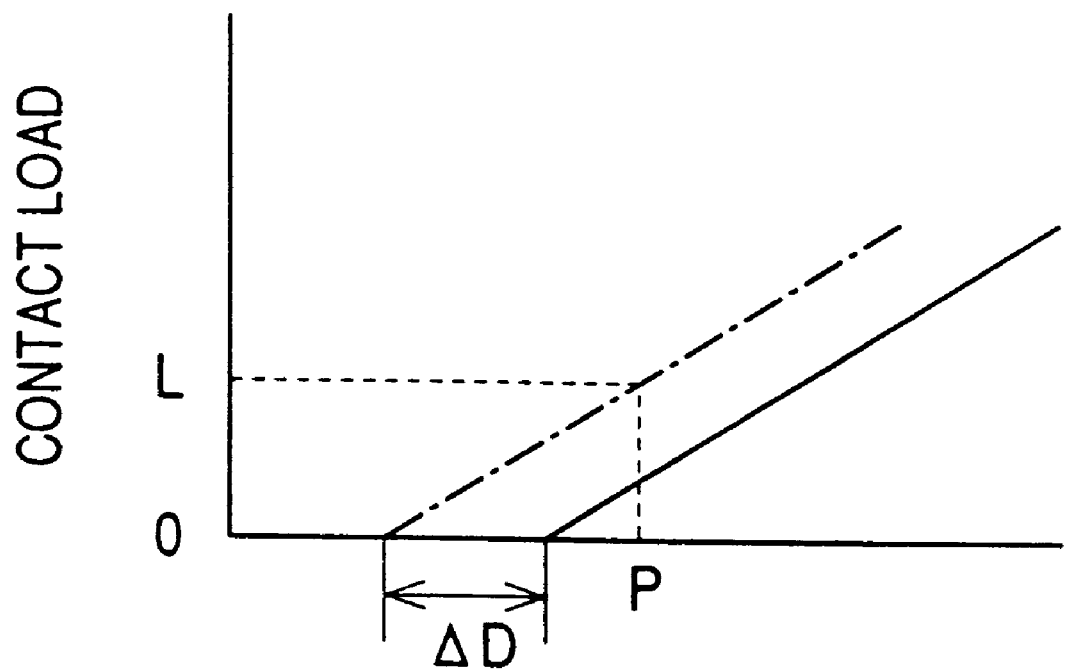
FIG. 5 is a graphical view representing a relationship between contact load and position of lift, the relationship being measured by the electronic-component mounting apparatus before the mounting apparatus starts the mounting of an electronic component.

Before the electronic component 178 contacts the load cell 206, the fist and second biasing forces are kept balanced by each other on the electronic-component mounting head 49, so that the suction device 120 and the electronic component 178 behave as if each element 120, 178 had no self weight. After the component 178 contacts the load cell 206, and as the suction device 120 is moved relative to the rotatable member 52, the elastic force of the first spring 130 increases and the respective elastic forces of the second spring 134 and the bellows 136 decrease. Thus, the difference between the first and second biasing forces is equal to the sum of respective absolute values of the increased amount of the elastic force of the first spring 130 and the decreased amounts of the elastic forces of the second spring 134 and the bellows 136. The load cell 206 detects a contact load which is equal to the difference between the first and second biasing forces. The amount of increase or decrease of each of the first and second springs 130, 134 and the bellows 136 is proportional to the distance of movement of the suction device 120 relative to the rotatable member 52, i.e., distance of downward movement of the lift 28. Accordingly, as shown in FIG. 5, the contact load linearly increases from zero in proportion to the distance of downward movement of the lift 28. A plurality of positions of the lift 28 and a plurality of contact loads which correspond to those positions, respectively, are detected and, based on the detected loads and positions, a relationship between contact load and position of lift 28 is obtained by calculation.

After a relationship between contact load and position of lift 28 (this relationship can be thought as a relationship between contact load and amount of movement of suction device 120 relative to rotatable member 52) is thus obtained, that is, after the spring characteristics of the first and second springs 130, 134 and the bellows 136 are determined, a position to which the lift 28 is moved downward so that each electronic component 178 is contacted with the printed circuit board with an appropriate contact load, is determined. In the case where the load cell 206 is disposed at a position lower by a distance, Δ D, than a surface of the circuit board on which electronic components 178 are to be mounted, a straight line (indicated at solid line in the figure) representing the obtained relationship is moved by the distance Δ D toward the origin to obtain another straight line indicated at one-dot chain line, which is used for determining a position, P, which corresponds to an appropriate contact load (i.e., target contact load), L. The position P is automatically determined by the control device 190 according to one of the programs. Data indicative of the position P are stored in the backup RAM 197.

In addition, when the suction device 120 holds each electronic component 178 by suction, it is also required that the suction device 120 be prevented from contacting the component 178 with an excessively high load, i.e., be contacted with the component 178 with an appropriate contact load (this contact load may, or may not, be equal to that with which the component 178 is contacted with the circuit board). Therefore, a position to which the lift 28 is moved downward to hold the component 178 by suction is determined based on the distance between the load cell 206 and the upper surfaces of electronic components 178 on the electronic-component supplying apparatus in a vertical direction, the thickness of the electronic component 178, and an appropriate contact load, and data indicative of the thus determined position are also stored in the backup RAM 197.

After the two positions to which the lift 28 is moved downward for holding each electronic component 178 by suction and mounting the component 178 on the printed circuit board, respectively, are thus determined, an automatic operation for amounting electronic components 178 on the circuit board is started. The suction device 120 is moved to the electronic-component supplying position right above each electronic component 178 to be held, and subsequently is moved downward to hold the component 178 by suction. Initially, the lift 28 is moved downward at a high speed. However, after the suction device 120 comes down near to the component 178, the speed of downward movement of the lift 28 is smoothly lowered, which contributes to preventing the increasing of the contact load due to the inertia force of the suction device 120 when the suction device 120 contacts the component 178. After the suction device 120 contacts the component 178, the lift 28 is further moved downward to the pre-determined position. Thus, the suction device 120 is contacted with the component 178 with the appropriate load.

As described above, the suction device 120 can be dealt with as if the device 120 had no weight. In addition, since the suction device 120 is held in splined engagement with the rotatable member 52 via the ball spline 126, the frictional resistance produced between the suction device 120 and the rotatable member 52 is very small. Thus, the suction device 120 can be contacted with each electronic component 178 with a load which is smaller than the self weight of the device 120. As the spring constants of the first and second springs 130, 134 and the bellows 136 increase, the slope of increase of the contact load increases and accordingly a small amount of error regarding the distance of downward movement of the lift 28 results in a large amount of error regarding the contact load. Therefore, it is preferred that the spring constants of those elements 130, 134, 136 be small.

After the suction device 120 holds each electronic component 178 by suction, and before the suction device 120 arrives at the electronic-component mounting position, an image of the component 178 held by the suction device 120 is taken by an image pick-up device. Based on the taken image, respective errors (i.e., translational errors) of the component 178 regarding its positions in the x-axis directions and the y-axis directions which are perpendicular to each other in a horizontal plane, and an error (i.e., rotational error) of the component 178 regarding its rotational position about an axis line of the rotatable member 52 are calculated. The translational errors are corrected by changing the respective positions of stopping of the suction device 120 in the x-axis and y-axis directions, and the rotational error is corrected by rotating the rotatable member 52. Although the suction nozzle 124 is detachably attached to the nozzle holder 122, the nozzle 124 is prevented from rotating relative to the holder 122, owing to the engagement of the sheet springs 166 and the engagement grooves 144. Thus, the suction nozzle 124 is prevented from rotating out of position, after the image of the component 178 held by the suction device 120 is taken, or after the rotational-position error of the component 178 is corrected. Accordingly, the component 178 can be mounted in its appropriate posture on the printed circuit board.

After the suction device 120 is moved to a position right above a prescribed position on the printed circuit board, the device 120 is moved downward and mounts the electronic component 178 on the circuit board. During this downward movement, too, the speed of movement of the lift 28 is lowered before the component 178 contacts the circuit board. Thus, the increase of the contact load due to the inertia force of the suction device 120 is avoided. The lift 28 is moved downward to the pre-determined position where the component 178 is contacted with the circuit board with the appropriate load. Therefore, even in the case where the component 178 is provided by a wafer and a small number of solder bumps, such as two or three, each of which is formed directly on the wafer and which has a diameter of 0.1 mm and a height of about 0.1 mm, those solder bumps are not damaged.

When the current suction nozzle 124 is replaced with another suction nozzle 124, e.g., because of wearing of the current suction pipe 152 or because of changing of the current sort of electronic components 178 to a different sort of electronic components 178, the suction nozzle 124 may be pulled downward so that the sheet springs 166 are elastically deformed and are released from the engagement with the engagement grooves 144. Thus, the current suction nozzle 124 is detached from the nozzle holder 122. Subsequently, another suction nozzle 124 including a different sort, or the same sort, of suction pipe 152 is attached to the nozzle holder 122.

Suction nozzles 124 are produced with accurate dimensions. So long as the same sort of suction nozzles 124 are used, the lift 28 may be moved downward to the position which is pre-determined using a suction device 120 including one of that sort of nozzles 124. In the case where the sort of the suction nozzles 124 is not changed but the sort of the electronic components 178 is changed to a different sort, it is required that the pre-determined position be corrected by an amount corresponding to the difference of respective thickness values of the old and new sorts of components 178. In this case, if the current target load should be changed to a different one, the pre-determined position should additionally be corrected by an amount corresponding to the difference of the two target loads. The correction of the pre-determined position is also automatically performed.

In the case where the current sort of suction nozzle 124 is replaced with a different sort of suction nozzle 124, a relationship between contact load and position of lift 124 is determined using a suction device 120 including the new sort of suction nozzle 124, and a position to which the lift 28 is moved downward is determined.

It is possible to determine, in advance, a position to which the lift 28 is moved downward, for each of all sorts of suction devices 120 that are to be used with the present mounting head 49.

As is apparent from the foregoing description, in the present embodiment, the rotatable member 52 and the support shaft 84 cooperate with each other to provide a head frame; the first spring 130 as an elastic member that is a sort of biasing device, and the self weight of the suction device 120 cooperate with each other to provide a first biasing device; and the second spring 134 as an elastic member that is a sort of biasing device, and the bellows 136 cooperate with each other to provide a second biasing device. In addition, the lift 28 provides a lift member; the load cell 206 provides a contact-load detecting device; the Z-axis encoder 204 provides a position detecting device which detects the positions of the lift member, or a relative-position detecting device which detects the positions of the suction device 120 relative to the head frame. Moreover, a portion of the control device 190 which determines the position to which the lift 28 is moved downward, based on the detection signals supplied from the load cell 206 and the Z-axis encoder 204, provides a device which determines the characteristics of the biasing devices, or a device which determines the position to which the lift 28 is moved downward; and a portion of the control device 190 which controls the lifting device 46 to move the lift 28 downward to the pre-determined position, provides a downward-movement control device.

Figure 6:
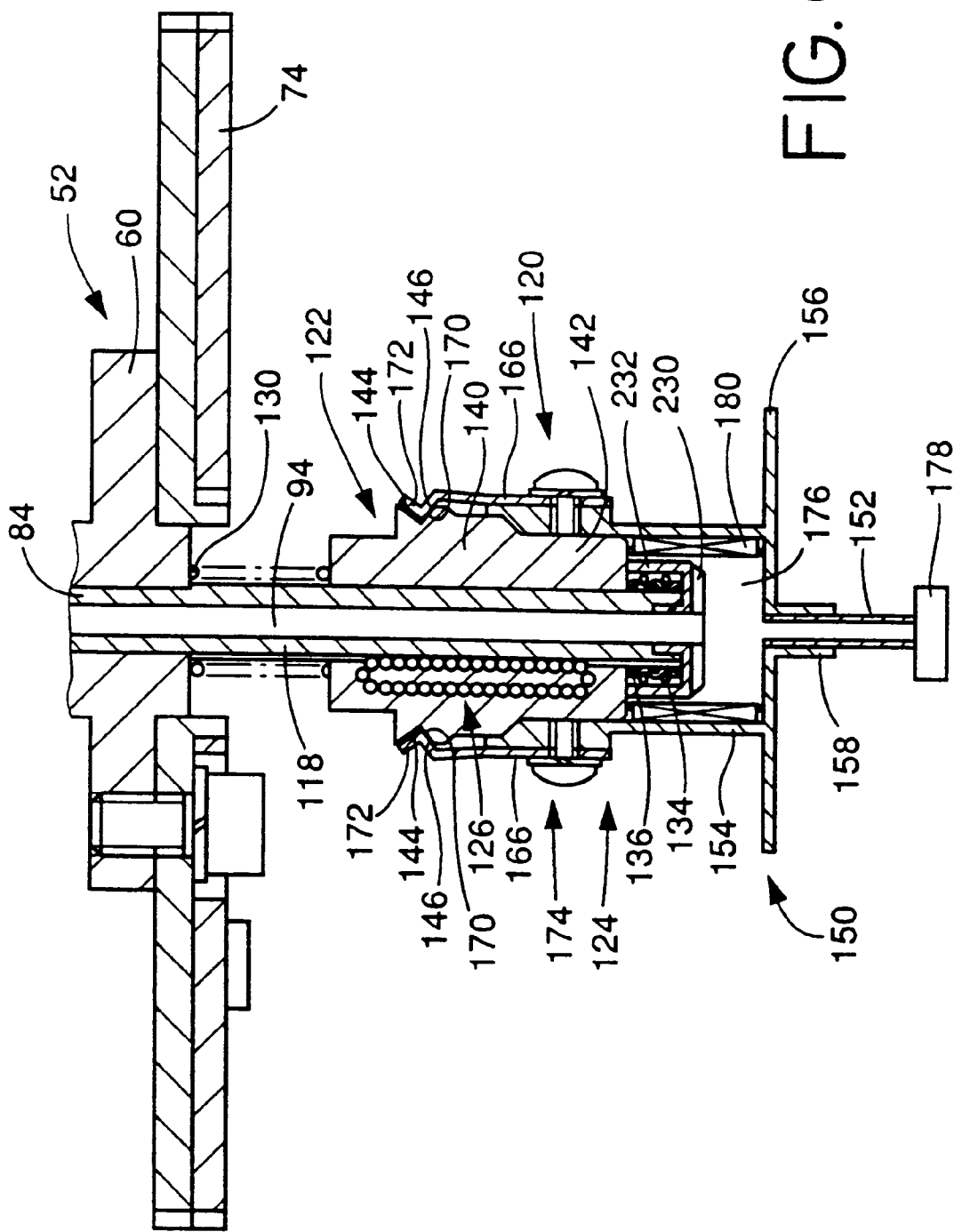
FIG. 6 is a front cross-section view of a part of an electronic-component mounting head as another embodiment of the present invention.

In the above-described embodiment, neither the movement of the suction device 120 in the direction in which the device 120 is biased by the first biasing device nor the movement of the suction device 120 in the direction in which the device 120 is biased by the second biasing device is limited. As shown in FIG. 6, however, the movement of the suction device 120 in the direction in which the device 120 is biased by the first spring 130 may be limited.

A spring seat 230 of the support shaft 84 includes a cylindrical stopper 232 which projects upward in parallel to the axis line of the support shaft 84. When the nozzle holder 122 is brought into contact with the stopper 232, the downward movement of the suction device 120 is limited. In the present embodiment, under the condition that the nozzle holder 122 is held in contact with the stopper 232, the first biasing force provided by the sum of the elastic force of the first spring 130 and the self weight of the suction device 120, is somewhat greater than the second biasing force provided by the sum of the respective elastic forces of the second spring 134 and the bellows 136. The nozzle holder 122 is pressed against the stopper 232 with a pressing force corresponding to the difference of the two biasing forces. This pressing force is smaller than an appropriate contact load with which the suction device 120 is contacted with each electronic component 178 when the component 178 is held by suction, and an appropriate contact load with which the component 178 is contacted with the printed circuit board when the component 178 is mounted on the circuit board.

Since the movement of the suction device 120 in the direction in which the device 120 is biased by the first spring 130 is limited, the device 120 is effectively prevented from vibrating, e.g., when the device 120 is moved.

Although in the above-described embodiments a position to which the suction device 120 is moved downward is determined by measuring a contact load under the condition that an electronic component 178 which will actually be mounted on a printed circuit board is held by the suction device 120, it is possible to measure a contact load by using an electronic component prepared for contact-load measurements only. Otherwise, it is possible to measure a contact load by using an electronic component 178 whose solder bumps are crushed in advance. As contact-load measurements are repeated, the solder bumps will be crushed little by little. Since an electronic component whose solder bumps are crushed and an electronic component whose solder bumps are not crushed provide different measurement results, it is preferred that the solder bumps of an electronic component used for contact-load measurements be crushed in advance.

In addition, it is possible to detect a contact load under the condition that an electronic component, either for actual use or for measurements only, is not held by the suction device.

Moreover, although the contact-load detecting device is mounted together with the electronic-component mounting head and the lifting device on the electronic-component mounting apparatus, it is possible that a contact-load detecting device be provided independent of the electronic-component mounting head and the lifting device and, when contact-load measurements are effected, the former be used with the latter.

The present invention is applicable to an electronic-component mounting head or an electronic-component mounting apparatus which mounts an electronic component on a substrate which is moved upward and downward. Otherwise, the present invention is applicable to an electronic-component mounting apparatus which corrects a rotational-position error of an electronic component or a substrate by rotating the substrate, or to an electronic-component mounting head employed in the mounting apparatus.

Moreover, the present invention is applicable to an indexing-type electronic-component mounting apparatus and an electronic-component mounting head employed in the indexing-type mounting apparatus. An indexing-type mounting apparatus includes an index table which is rotatable about an axis line, and a plurality of electronic-component mounting heads which are supported by the index table such that the mounting heads are located on a circle whose center coincides with the axis line of rotation of the index table. The index table is intermittently rotated by a table rotating device, so that each of the mounting heads is sequentially moved to each of various operative positions including an electronic-component supplying position, an electronic-component mounting position, and an image picking-up position and accordingly a plurality of operations are concurrently carried out. In this mounting apparatus, it is preferred that a lifting device be provided at each of the electronic-component supplying position and the electronic-component mounting position, so that the lifting device moves downward and upward a lift member of each mounting head being stopped at the supplying or mounting position.

In the case where a single electronic-component mounting apparatus includes a plurality of electronic-component mounting heads, or in the case where a single electronic-component mounting head includes a plurality of suction devices, it is preferred that before the mounting of electronic components is started, each of the suction devices be tested for measuring a contact load applied by an electronic component to a substrate and determining respective positions to which each suction device is moved downward for holding an electronic component by suction and for mounting the component on a substrate, and that the thus determined positions be stored in a position storing device. In the latter case, a lift member of each suction device is moved downward to the positions read from the position storing device, when an electronic component is held by suction by each suction device and when the component is mounted by each suction device.

The first biasing device may include, in place of the first compression coil spring, a different elastic member as a sort of biasing device, such as a rubber block. Otherwise, the first biasing device may be provided by the self weight of the suction device only. In the last case, the biasing force of the first biasing device cannot be changed. However, in the case where the second biasing device includes an elastic member, the biasing force of the second biasing device can be changed by moving the suction device relative to the head frame and accordingly contact load applied by an electronic component to a substrate can be controlled.

According to the present invention, it is not essential to provide the function of controlling the downward movement of the suction device (or the upward movement of a substrate) for adjusting the contact load. For example, in the case where only a single sort of electronic components are mounted on a substrate, or in the case where a plurality of sorts of electronic components are mounted and some amount of change of the contact load is allowed, it is possible to employ a fixed position as a position to which the suction device is moved downward. In addition, in the case where a plurality of sorts of electronic components are mounted by a plurality of exclusive suction devices, respectively, it is possible that the suction devices may have different dimensions which ensure that the suction devices are moved downward to the same position that is common to all the sorts of electronic components.

The contact load may be controlled by means other than means for causing the relative movement of the head frame and the suction device. For example, in the case where at least one of the first and second biasing devices includes a biasing device, such as a solenoid or a diaphragm-type air cylinder, whose biasing force is variable by changing, e.g., an electric current or an air pressure supplied thereto, the contact load may be controlled without needing the relative movement of the head frame and the suction device.

In each of the above-described embodiments, the suction device is externally fit on the head frame. However, the present invention is applicable to an electronic-component mounting head in which a suction device is internally fit in a head frame via bearings such that the suction device is movable in an axial direction thereof, and to an electronic-component mounting apparatus including the mounting head.

Otherwise, the present invention may be embodied with various changes or improvements that may occur to those skilled in the art without departing from the claims.

We claim:

1. An electronic-component mounting apparatus, comprising:

an electronic-component mounting head including a head frame having a first fitting portion, a suction device having a second fitting portion, one of the first and second fitting portions being fit in the other fitting portion, so that the suction device is supported by the head frame, the suction device applying suction to an electronic component to hold the component, a rolling bearing which is provided between the first fitting portion of the head frame and the second fitting portion of the suction device so that the suction device is movable upward and downward relative to the head frame via the rolling bearing, a first biasing device which provides a downward biasing force to bias the suction device downward, and a second biasing device which is provided between the head frame and the suction device and which provides an upward biasing force to bias the suction device upward against the downward biasing force of the first biasing device;

a lift member which supports the head frame of the mounting head;

a lifting device which is connected to the lift member and which moves the lift member upward and downward;

a relative-position detecting device which detects at least one position of the suction device of the mounting head relative to the head frame thereof;

a load detecting device which detects at least one load applied thereto from the suction device at said at least one position thereof relative to the head frame detected by the relative-position detecting device; and a downward-movement control device which is connected to the lifting device, the relative-position detecting device, and the load detecting device and which controls the lifting device to move the lift member downward to a position determined based on said at least one load detected by the load detecting device, said at least one relative position detected by the relative-position detecting device, and a predetermined target contact load at which the electronic component held by the suction device is to be contacted with, and mounted on, a substrate.

2. An apparatus according to claim 1, wherein the downward-movement control device comprises:

a memory which stores a relationship between the load detected by the load detecting device and the relative position detected by the relative-position detecting device; and a position determining device which determines, based on the relationship stored in the memory device and the target contact load, the position to which the lift member is moved downward by the lifting device.

3. An apparatus according to claim 1, wherein the load detecting device comprises a load cell which is provided at a load detecting position different from an electronic-component supplying position and an electronic-component mounting position.

4. An apparatus according to claim 1, wherein the lifting device comprises:

a lift-member supporting member which supports the lift member such that the lift member is movable upward and downward;

a feeding screw and a feeding nut which are threadedly engaged with each other, one of which is attached to the lift member and the other of which is attached to the lift-member supporting member; and an electronic motor which rotates said other of said screw and nut, and wherein the relative-position detecting device comprises a rotation-position detector which detects a rotation position of the electric motor.

5. An apparatus according to claim 1, wherein the first biasing device comprises a weight of the suction device.

6. An apparatus according to claim 1, wherein each of the first and second biasing devices comprises a spring.

7. An apparatus according to claim 1, wherein the suction device comprises a nozzle holder which is supported by the head frame such that the nozzle holder is movable upward and downward relative to the head frame and which is biased by the first and second biasing devices in opposite directions, respectively, a suction nozzle, and an attaching device for attaching the suction nozzle to the nozzle holder such that the suction nozzle attached to the nozzle holder is detachable from the nozzle holder.

8. An apparatus according to claim 7, wherein the attaching device comprises a relative-rotation preventing device which prevents the suction nozzle from rotating relative to the nozzle holder.

9. An apparatus according to claim 1, further comprising a vibration preventing device which prevents vibration of the suction device relative to the head frame.

10. An apparatus according to claim 1, wherein the head frame comprises a support shaft which has a negative-pressure passage extending in an axial direction thereof and opening in a lower end thereof, and wherein the suction device is externally fit on the support shaft via the rolling bearing.

11. An electronic-component mounting apparatus, comprising:

an electronic-component mounting head including a head frame having a first fitting portion, a suction device having a second fitting portion, one of the first and second fitting portions being fit in the other fitting portion, so that the suction device is supported by the head frame such that the suction device is movable upward and downward relative to the head frame, the suction device applying suction to an electronic component to hold the component, and a biasing device which is provided between the head frame and the suction device and which biases the suction device upward with a biasing force which is changeable with a position of the suction device relative to the head frame in a direction of the upward and downward movement of the suction device;

a lift member which supports the head frame of the mounting head;

a lifting device which is connected to the lift member and which moves the lift member upward and downward;

a relative-position detecting device which detects at least one position of the suction device relative to the head frame in said direction;

a load detecting device which detects at least one load applied thereto from the suction device at said at least one position thereof relative to the head frame detected by the relative-position detecting device; and a downward-movement control device which is connected to the lifting device, the relative-position detecting device, and the load detecting device and which controls the lifting device to move the lift member downward to a position determined based on said at least one load detected by the load detecting device, said at least one relative position detected by the relative-position detecting device, and a predetermined target contact load at which the electronic component held by the suction device is to be contacted with, and mounted on, a substrate.

12. An apparatus according to claim 11, wherein the downward-movement control device comprises:

a memory which stores a relationship between the load detected by the load detecting device and the relative position detected by the relative-position detecting device; and a position determining device which determines, based on the relationship stored in the memory device and the target contact load, the position to which the lift member is moved downward by the lifting device.

13. An apparatus according to claim 11, wherein the biasing device comprises an elastic member.

14. An apparatus according to claim 11, wherein the electronic-component mounting head further comprises a rolling bearing which is provided between the first fitting portion of the head frame and the second fitting portion of the suction device so that the suction device is movable upward and downward relative to the head frame via the rolling bearing.

15. An electronic-component mounting apparatus, comprising:

an electronic-component mounting head including a head flame having a first fitting portion, a suction device having a second fitting portion, one of the first and second fitting portions being fit in the other fitting portion, so that the suction device is supported by the head frame such that the suction device is movable upward and downward relative to the head frame, the suction device applying suction to an electronic component to hold the component, and a biasing device which is provided between the head frame and the suction device and which biases the suction device upward with a biasing force which is changeable with a position of the suction device relative to the head frame in a direction of the upward and downward movement of the suction device;

a lift member which supports the head frame of the mounting head;

a lifting device which is connected to the lift member and which moves the lift member upward and downward; and a downward-movement control device which is connected to the lifting device and which controls the lifting device to move the lift member downward to a position corresponding to a predetermined target contact load at which the electronic component held by the suction device is to be contacted with, and mounted on, a substrate.

16. A method of mounting an electronic component on a substrate, comprising:

preparing an electronic-component mounting head including a suction device which applies suction to the electronic component to hold the component and which is supported by a head frame via a rolling bearing such that the suction device is movable upward and downward relative to the head flame via the rolling bearing and such that the suction device is biased downward by a first biasing device and is biased upward by a second biasing device;

detecting at least one position of the suction device relative to the head flame;

detecting at least one total downward biasing force applied to the suction device by the first and second biasing devices at said at least one detected position of the suction device relative to the head frame;

determining, prior to an electronic-component mounting operation, a relationship between position of the suction device relative to the head frame and total downward biasing force applied to the suction device, based on said at least one detected position of the suction device and said at least one detected total downward biasing force applied to the suction device;

determining, based on the determined relationship, a dimension of the electronic component in a direction in which the suction device is moved relative to the head frame, and a predetermined target contact load at which the electronic component is to be contacted with the substrate, a position to which the head frame is to be moved downward;

moving the head frame downward to the determined position; and mounting the electronic component held by the suction device, on the substrate, at the determined position.

17. A method of mounting an electronic component on a substrate by using an electronic-component mounting head including a suction device which applies suction to the electronic component to hold the component and which is supported by a head frame such that the suction device is movable upward and downward relative to the head frame and such that the suction device is biased upward by a biasing device, comprising:

detecting at least one position of the suction device relative to the head frame;

detecting at least one total downward biasing force applied to the suction device by a weight of the suction device and the biasing device at said at least one detected position of the suction device relative to the head frame;

determining, prior to an electronic-component mounting operation, a relationship between position of the suction device relative to the head frame and total downward biasing force applied to the suction device, based on said at least one detected position of the suction device and said at least one detected total downward biasing force applied to the suction device;

determining, based on the determined relationship, a dimension of the electronic component in a direction in which the auction device is moved relative to the head frame, and a predetermined target contact load at which the electronic component is to be contacted with the substrate, a position to which the head frame is to be moved downward;

moving the head frame downward to the determined position; and mounting the electronic component held by the suction device, on the substrate at the determined position.

* * * * *